(12) United States Patent  
Gotoda et al.

(10) Patent No.: US 8,390,007 B2  
(45) Date of Patent: Mar. 5, 2013

(54) SEMICONDUCTOR LIGHT EMITTING DEVICE AND METHOD OF FABRICATING SEMICONDUCTOR LIGHT EMITTING DEVICE

(75) Inventors: Toru Gotoda, Yokohama (JP); Takahiro Sato, Kawasaki (JP); Toshiyuki Oka, Yokohama (JP); Shinya Nunoue, Ichikawa (JP); Kotaro Zaima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 12/874,399

(22) Filed: Sep. 2, 2010

(65) Prior Publication Data

US 2011/0220933 A1 Sep. 15, 2011

(30) Foreign Application Priority Data

Mar. 9, 2010 (JP) ................................. 2010-052214

(51) Int. Cl. *H01L 33/00* (2010.01)
(52) U.S. Cl. ....... 257/95; 257/81; 257/98; 257/E25.019; 438/22; 438/78
(58) Field of Classification Search .................. None
See application file for complete search history.

(56) References Cited

U.S. PATENT DOCUMENTS

| | | | |
|---|---|---|---|
| 6,463,088 B1 * | 10/2002 | Baillargeon et al. | 372/46.01 |
| 7,781,242 B1 * | 8/2010 | Chen et al. | 438/29 |
| 2007/0298587 A1 | 12/2007 | Park et al. | |

FOREIGN PATENT DOCUMENTS

| | | |
|---|---|---|
| JP | 2002-16312 | 1/2002 |
| JP | 2005-64247 | 3/2005 |
| JP | 2005-101566 | 4/2005 |
| JP | 2006-287113 | 10/2006 |
| JP | 2008-282966 | 11/2008 |
| JP | 2009-10215 | 1/2009 |
| JP | 2009010215 A * | 1/2009 |

OTHER PUBLICATIONS

Office Action issued Feb. 14, 2012 in Japanese Patent Application No. 2010-052214 (with English translation).  
U.S. Appl. No. 13/037,687, filed Mar. 1, 2011, Zaima, et al.  
Japanese Office Action issued May 11, 2012, in Japan Patent Application No. 2010-052214 (with English translation).

(Continued)

*Primary Examiner* — Tan N Tran  
*Assistant Examiner* — Scott R Wilson  
(74) *Attorney, Agent, or Firm* — Oblon, Spivak, McClelland, Maier & Neustadt, L.L.P.

(57) ABSTRACT

A semiconductor light emitting device has a light emitting element, and first and second electrodes. The light emitting element has a nitride-based III-V compound semiconductor on a substrate. The first and second electrodes are disposed on both sides of the light emitting element, respectively. The light emitting element has a light emitting layer, a first conductive type semiconductor layer, and a second conductive type semiconductor layer. The first conductive type semiconductor layer is disposed between the light emitting layer and the first electrode. The second conductive type semiconductor layer is disposed between the light emitting layer and the second electrode. One surface of the first conductive type semiconductor layer contacts the first electrode and is a light extraction surface which is roughly processed so as to have two or more kinds of oblique angles.

24 Claims, 3 Drawing Sheets

OTHER PUBLICATIONS

U.S. Appl. No. 12/728,841, filed Mar. 22, 2010, Ando, et al.
U.S. Appl. No. 12/874,568, filed Sep. 2, 2010, Gotoda, et al.
U.S. Appl. No. 12/874,625, filed Sep. 2, 2010, Gotoda et al.
U.S. Appl. No. 12/874,425, filed Sep. 2, 2010, Zaima, et al.
U.S. Appl. No. 12/874,475, filed Sep. 2, 2010, Zaima, et al.
Office Action issued Aug. 31, 2012 in Japanese Application No. 2010-052214 (With English Translation).

* cited by examiner (a)
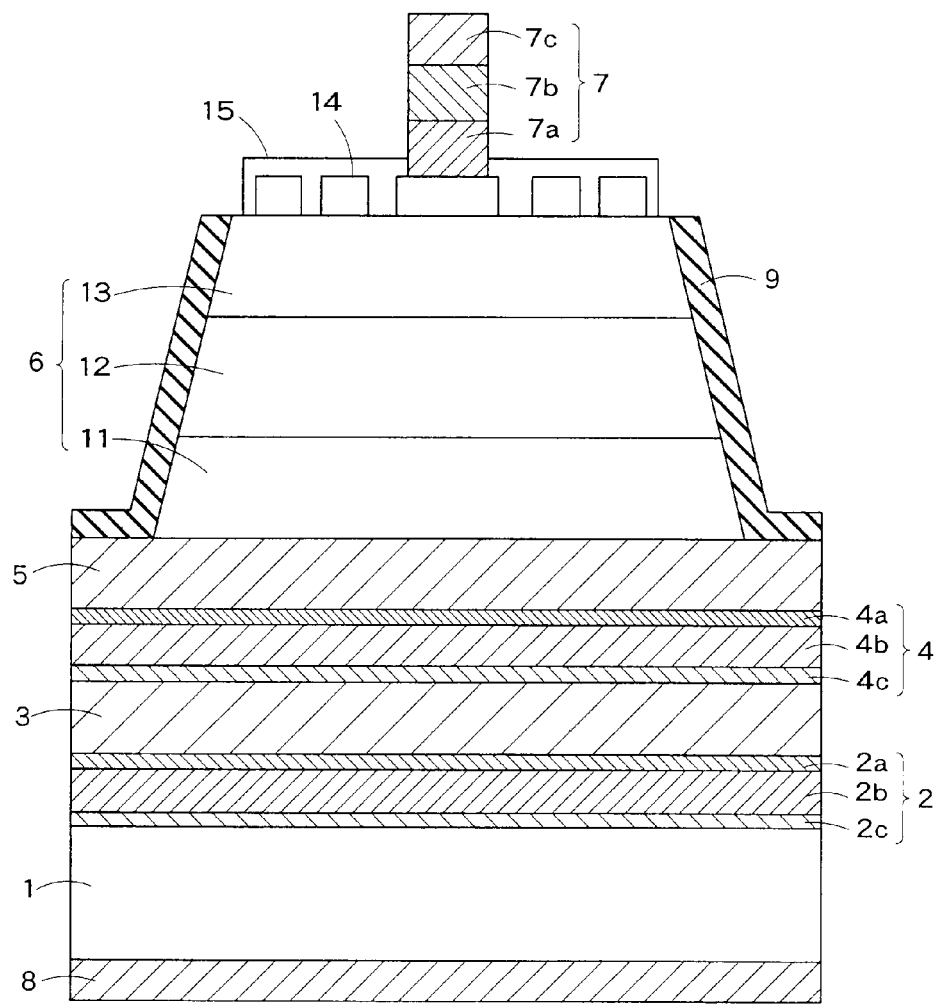
(b)
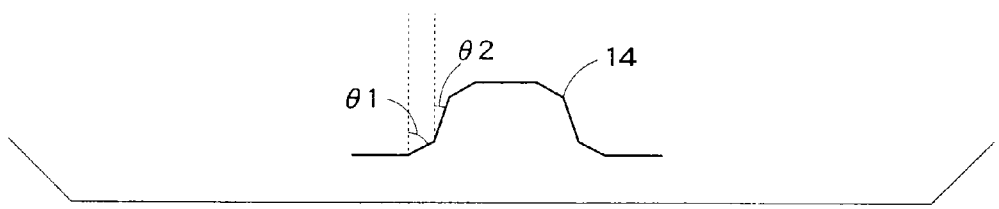
F I G. 1

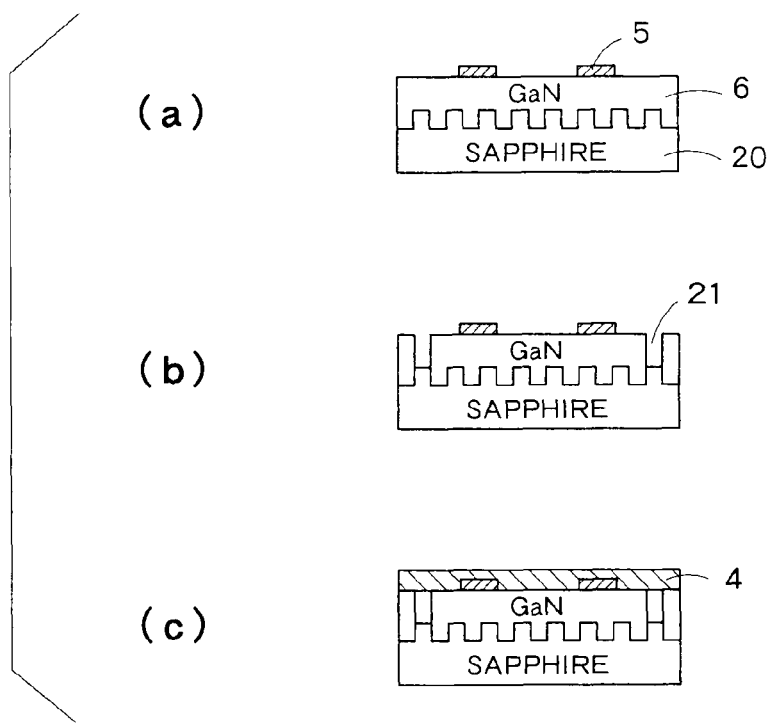
F I G. 2
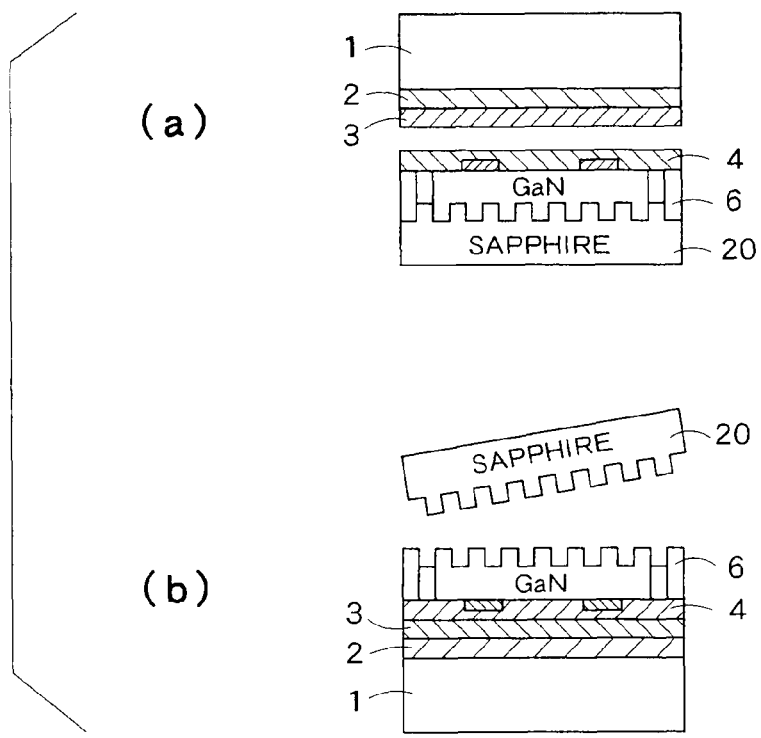
F I G. 3

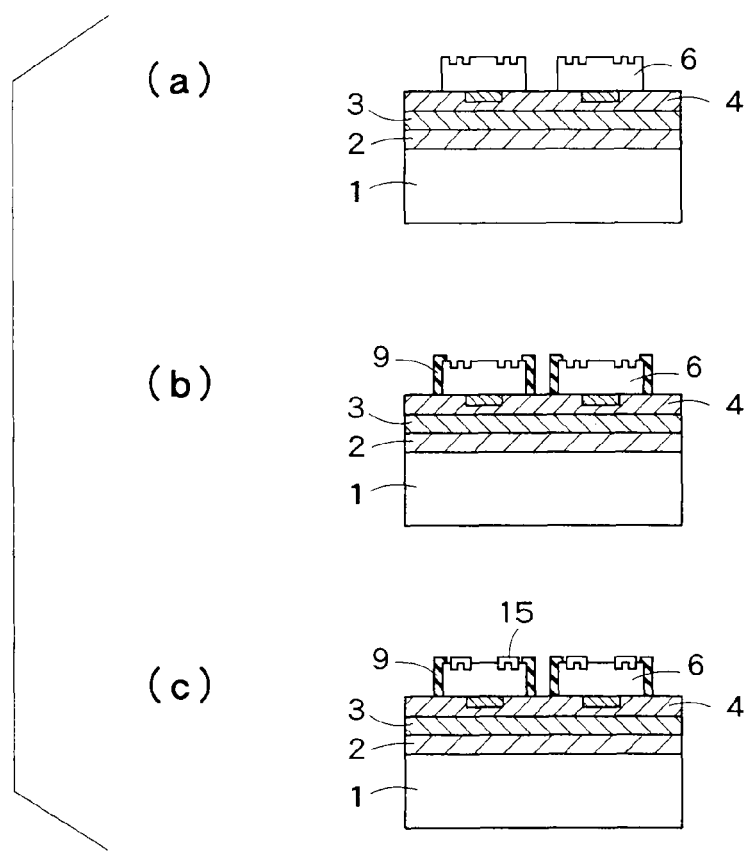
F I G. 4
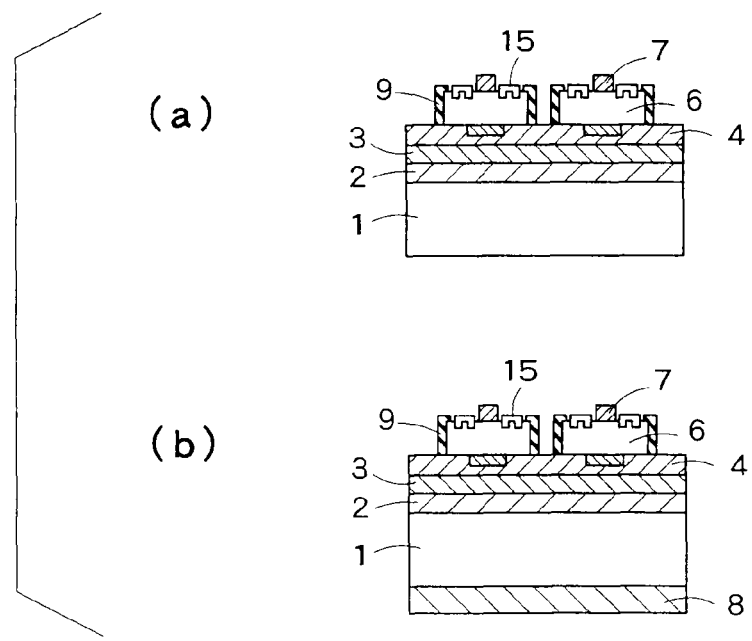
F I G. 5

US 8,390,007 B2

SEMICONDUCTOR LIGHT EMITTING DEVICE AND METHOD OF FABRICATING SEMICONDUCTOR LIGHT EMITTING DEVICE

CROSS REFERENCE TO RELATED APPLICATIONS

This application is based upon and claims the benefit of priority from the prior Japanese Patent Application No. 2010-52214, filed on Mar. 9, 2010, the entire contents of which are incorporated herein by reference.

FIELD

An embodiment relates to a semiconductor light emitting device using a nitride-based group III-V compound semiconductor and a method of fabricating a semiconductor light emitting device.

BACKGROUND

Optical devices, such as laser diodes (LD) and light emitting diodes (LED) can be fabricated by crystal growth of a nitride-based group III-V compound semiconductor on a sapphire substrate, a SiC substrate, etc. As technical problems for optical devices of this type, there are improvements in heat dissipation performance and light extraction efficiency.

Recently, there has been proposed a technique in which a problem of heat dissipation performance can be solved and large current operation is feasible by bonding a nitride-based group III-V compound semiconductor to a substrate superior to a sapphire substrate or a SiC substrate in heat dissipation performance and peeling off the substrate by a laser lift-off method (see, U.S. Patent Application Publication No. US 2007/0298587.)

Concerning the improvement in light extraction efficiency as the other problem, it has been experimentally confirmed that optical output of two times or more is attained, compared to a flat light emitting surface, by processing an light emitting surface with strong alkali etching using a strong alkali solution such as potassium hydroxide or sodium hydroxide to make a rough surface.

The process of making the rough surface with the strong alkali etching has, however, a problem of difficulty in process integration because not only the light emitting surface of a light emitting device but also electrodes, a passivation film, a support substrate, etc. are eroded to some degree.

BRIEF DESCRIPTION OF THE DRAWINGS

FIG. 1(a) is a sectional view of a semiconductor light emitting device according to an embodiment and FIG. 1(b) is a view showing an example of an uneven shape of a light extraction surface;

FIG. 2 is a process view showing an example of a production process of the semiconductor light emitting device of the embodiment;

FIG. 3 is a process view following to FIG. 2;

FIG. 4 is a process view following to FIG. 3; and

FIG. 5 is a process view following to FIG. 4.

DETAILED DESCRIPTION

According to one embodiment, a semiconductor light emitting device has a light emitting element, and first and second electrodes. The light emitting element has a nitride-based III-V compound semiconductor on a substrate. The first and second electrodes are disposed on both sides of the light emitting element, respectively. The light emitting element has a light emitting layer, a first conductive type semiconductor layer, and a second conductive type semiconductor layer. The first conductive type semiconductor layer is disposed between the light emitting layer and the first electrode. The second conductive type semiconductor layer is disposed between the light emitting layer and the second electrode. One surface of the first conductive type semiconductor layer contacts the first electrode and is a light extraction surface which is roughly processed so as to have two or more kinds of oblique angles.

Embodiments will now be explained with reference to the accompanying drawings.

FIG. 1(a) is a sectional view of a semiconductor light emitting device according to an embodiment. The semiconductor light emitting device of FIG. 1(a) has a structure in which a barrier metal layer 2, a bonding metal layer 3, a barrier metal layer 4, a p-type ohmic electrode layer 5, and a nitride-based group III-V compound semiconductor layer (light emitting element) 6 are laminated in order on a support substrate 1. An n-electrode layer (a first electrode layer) 7 is formed on the upper surface of the compound semiconductor layer 6. A p-electrode layer (a second electrode layer) 8 is formed on the rear surface of the support substrate 1.

The side faces of the compound semiconductor layer 6 is formed into a forward tapered shape. The side faces are covered with an insulating layer 9. The compound semiconductor layer 6 has a p-type semiconductor layer (a second conductive-type semiconductor layer) 11, a light emitting layer 12, and an n-type semiconductor layer (a first conductive-type semiconductor layer) 13 in order from the direction of the support substrate 1. A light extraction surface 14 on the upper surface of the n-type semiconductor layer 13 is processed into an uneven shape. The light extraction surface 14 is covered with a refractive-index relaxation film 15.

The light extraction surface 14 has an uneven shape processed roughly at two or more kinds of oblique angles. FIG. 1(b) shows an example of the uneven shape. In this example, each uneven portion has oblique angles θ1 and θ2 with respect to the normal line direction of the substrate surface.

The reason why the light extraction surface 14 is formed into an uneven shape with two or more kinds of oblique angles is as follows: As described later, the light extraction surface 14 of the compound semiconductor layer 6 is obtained by peeling off a sapphire substrate by a laser lift-off method. Then, the compound semiconductor layer 6 is protected from receiving excessive stress at peeling-off and being damaged. From this point of view, preferable angle ranges of θ1 and θ2 are 20°<θ1<40° and 0°<θ2<20°. The depth of the uneven portion is, for example, 2 μm or less. The width of the uneven portion is, for example, 1 μm or more.

The n-electrode layer 7 is formed on the refractive-index relaxation film 15. The n-electrode layer 7 is, for example, a 3-layer-structured ohmic electrode layer having a Ti layer 7a that is in contact with the refractive-index relaxation film 15, an Al layer 7b formed on the Ti layer 7a, and an Au layer 7c formed on the Al layer 7b.

The n-electrode layer 7 is not limited to a 3-layer structure but may be a 4-layer structure of Ti/Al/Ai/Au or a 5-layer structure of Ti/Al/Ta/Pt/Au.

FIGS. 2 to 5 are process views that show an example of a fabrication process of a semiconductor light emitting device according to the embodiment. At first, after a photoresist applied onto a sapphire substrate 20 by spin coating is prebaked, exposure and development are conducted through photolithography to pattern the photoresist.

Next, the patterned photoresist is post-baked (thermal hardening). The baking temperature at the time of post-baking is preferably at the lowest of 150 C.° or higher. The reason is that, by baking a photoresist at a high temperature of 150 C.° or higher, an edge shape of the photoresist becomes roughly a hemisphere shape by surface tension.

Next, dry etching, for example, ICP-RIE (Inductive Coupled Plasma Reactive Ion Etching) is performed by using the photoresist as an etching mask. Accordingly, the shape of the photoresist is transferred to the sapphire substrate 20, thus forming an uneven shape thereon.

Since the edge shape of the photoresist to be used for the transfer has roughly a hemisphere shape, the sapphire substrate 20 after the transfer is etched into a shape similar to a hemisphere. A sphere is a shape in which angles with respect to a reference plane continuously vary. Therefore, the surface of the sapphire substrate 20 becomes an uneven shape with two or more kinds of oblique angles, as shown in FIG. 1(b).

The technique to form the surface of the sapphire substrate 20 into an uneven shape with two or more kinds of oblique angles is not limited to that described above.

For example, the etching of the sapphire substrate 20 is performed at least two times. In the first etching of the sapphire substrate 20, an uneven shape having an oblique angle θ1 is formed on the surface of the sapphire substrate 20 with a $SiO_2$ film as an etching mask. Next, in the second etching of the sapphire substrate 20, a photoresist is used as an etching mask to form an uneven shape having an oblique angle θ2 on the surface of the sapphire substrate 20. Accordingly, the surface of the sapphire substrate 20 can be formed into an uneven shape having two or more kinds of oblique angles.

As described above, the surface of the sapphire substrate 20 has been formed into an uneven shape having two or more kinds of oblique angles by any available technique, and then the layers in the compound semiconductor layer 6 are formed on the sapphire substrate 20 in order. Accordingly, as shown in FIG. 2(a), the compound semiconductor layer 6 is formed with a surface shape matched to the uneven shape of the sapphire substrate 20.

The compound semiconductor layer 6 is preferably a GaN-based single crystal that can grow on the sapphire substrate 20 or a SiC substrate by crystal growth at high quality. A concrete example of the material is $Al_xGa_{1-x-y}In_yN$ ($0 \leq x \leq 1$, $0 \leq y \leq 1$).

A substrate based for the compound semiconductor layer 6 grown by crystal growth is thus not limited to the sapphire substrate 20 but may be a SiC substrate, for example.

The compound semiconductor layer 6 is formed of a buffer layer, an n-type contact layer, the n-type semiconductor layer 13, the light emitting layer 12, the p-type semiconductor layer 11, and a p-type contact layer laminated in order from the side closer to the sapphire substrate 20. These layers are deposited one after another by, for example, metal organic chemical vapor deposition (MOCVD). The n-type contact layer and the buffer layer are omitted in FIG. 1.

The n-type contact layer is a GaN-based semiconductor layer doped with a larger amount of n-type impurities than those of the n-type semiconductor layer 13 and the buffer layer. The buffer layer is formed by doping a GaN-based semiconductor layer with n-type impurities, such as silicon or germanium, in the impurity concentration from about $1\times10^{18}$ to about $2\times10^{18}$ cm$^{-3}$. The growth temperature of the buffer layer is about 1000 to 1100° C.

The n-type semiconductor layer 13 is formed by doping a GaN-based semiconductor layer with impurities of Si. The impurity concentration of Si is about $5\times10^{18}$ cm$^{-3}$.

A structure used for the light emitting layer 12 is a SQW structure in which an InGaN-made quantum well layer having a film thickness of several nanometers and undoped-InGaN-made barrier layers each having a film thickness of several nanometers provided on both sides of the quantum well layer are laminated in order. Or, the layer 12 is a MQW structure in which quantum well layers and barrier layers are laminated to one another. The growth temperature is about 700 to 800° C.

The p-type semiconductor layer 11 is formed by doping a GaN-based semiconductor layer with p-type impurities, such as magnesium or zinc, in the impurity concentration from about $4\times10^{18}$ to about $1\times10^{20}$ cm$^{-3}$. The p-type contact layer to be formed on top of the p-type semiconductor layer 11 is doped with p-type impurities, such as magnesium, at the impurity concentration of about $1\times10^{19}$ cm$^{-3}$. The growth temperature is about 1000 to 1100° C.

Next, the p-type ohmic electrode layer 5 is selectively formed on the p-type contact layer (FIG. 2(a)). The p-type ohmic electrode layer 5 serves both as an ohmic contact layer and as a highly reflective electrode layer. By forming the p-type ohmic electrode layer 5, it is possible to lead light generated by the light emitting layer 12 in the direction of the light extraction surface 14 or to reflect light at the side faces of the compound semiconductor layer 6. A characteristic required for the ohmic contact layer is a low contact resistance with the p-type semiconductor layer 11. A material that achieves this characteristic is Ni, for example. Moreover, materials preferable for the highly reflective electrode layer are Ni, Ag, and so on.

According to the experiment by the inventor, it was found that ohmic contact is achieved when the p-type ohmic electrode layer 5 is formed into a laminated structure of an Ni layer and an Ag layer and is thermally treated at about 400 C.°. In this case, it is preferable that the film thickness of Ni is thin as much as possible, such as about several nanometers and the film thickness of Ag is about 200 nanometers.

The material of the p-type ohmic electrode layer 5 may be of a platinum group such as Pt, Ru, Os, Rh, Ir and Pd, besides Ni and Ag described above. Ohmic contact can be achieved for a metal besides Ni and Ag, in accordance with the impurity concentration or the thermal treatment conditions of the p-type semiconductor layer 11.

Next, as shown in FIG. 2(b), isolation grooves 21 are formed in the compound semiconductor layer 6 in conformity to the edge locations of a laser beam to be emitted by the laser lift-off method. If there is no isolation groove 21, the tracks of laser beam edges might be physically formed on the compound semiconductor layer 6.

Next, as shown in FIG. 2(c), the barrier metal layer 4 is formed on the compound semiconductor layer 6. The barrier metal layer 4 is a laminated film of a layer 4a that is in contact with the p-type ohmic electrode layer 5, a layer 4b that is in contact with the layer 4a, and a layer 4c that is in contact with the layer 4b and the bonding metal layer 3. The material of the layer 4a is preferably a metal that exhibits a high bonding strength to the p-type ohmic electrode layer 5. Especially, Ti and Ni are preferable. The layer 4b is a layer for preventing mutual diffusion between the p-type ohmic electrode layer 5 and the bonding metal layer 3. Especially, Pt is preferable. The material of the layer 4c is preferably a metal that tends to mingle with the bonding metal layer 3, for example, Au or AuSn. The layers in the barrier metal layer 4 are formed by deposition or sputtering.

The p-type ohmic electrode layer 5 and the barrier metal layer 4 explained in the above processes are formed on the sapphire substrate 20. In parallel with these processes, fabrication on the support substrate 1 is also performed. On the support substrate 1, the barrier metal layer 2 and the bonding metal layer 3 are formed in order. The support substrate 1 requires both characteristics of heat dissipation performance and electrical conductivity, the material of which is Ge, Si, Cu, CuW, etc.

The barrier metal layer 2 has a layer 2a that tends to mingle with the bonding metal layer 3, a layer 2b for prevention of mutual diffusion that is in contact with the layer 2a, and a layer 2c that is in contact with the layer 2b and exhibits a high bonding strength to the support substrate 1.

The material of the bonding metal layer 3 to be formed on the barrier metal layer 2 is, for example, AuSn. Its thickness is preferably 2 µm or more. Although depending on bonding conditions, when a film thickness of the bonding metal layer 3 is 2 µm or less, degradation is expected during processes in a clean room due to decrease in bonding strength.

Thereafter, as shown in FIG. 3(a), the sapphire substrate 20 and the support substrate 1 are boned to each other. When the substrates 1 and 20 are bonded by a substrate bonding method through thermo compression bonding, large bend might occur due to difference in coefficients of thermal expansion between the sapphire substrate 20 and the support substrate 1. Due to the bend, when the sapphire substrate 20 is peeled off by the laser lift-off method, the sapphire substrate 20 might crack. Because of this, the support substrate 1 is preferably not a metallic but a Si substrate or a Ge substrate. When the subsequent dicing process is taken into consideration, the Si substrate is preferable.

When the support substrate 1 is bonded by the substrate bonding method, the temperature is set to about 300 to 350° C., and the load at about 500 to 1000N is applied.

Next, the p-electrode layer 8 is formed on the support substrate 1. The material of the p-electrode layer 8 is Ti, Pt, Au, etc.

Next, as shown in FIG. 3(b), the sapphire substrate 20 is peeled off by the laser lift-off method. To be more concrete, a laser beam is emitted to the sapphire substrate 20 at the rear side and laser positioning is made so that laser beam edges match the isolation grooves 21. The laser power density at this time is about 0.6 to 0.8 J/cm$^2$. A KrF laser of about 248 nm in wavelength is used.

Next, as shown in FIG. 4(a), after a photoresist is applied to the entire surface of the compound semiconductor layer 6, the photoresist is patterned in conformity to the shape of a light emitting device and the compound semiconductor layer 6 is selectively etched by RIE. In FIG. 4(a), the side walls of the light emitting device formed of the compound semiconductor layer 6 are drawn extending vertically to the substrate surface, for simplicity. Practically, however, the side walls become a forward tapered shape, as shown in FIG. 1.

Next, as shown in FIG. 4(b), after the insulating layer 9 is formed on the entire surface of the substrate by sputtering, the insulating layer 9 is formed only on the sidewall portions of the compound semiconductor layer 6 that corresponds to a light emitting device, by etching using a photoresist. The material of the insulating layer 9 is, for example, SiO$_2$ or SiN.

Since the side walls of the light emitting device of this embodiment have a forward tapered shape, the insulating layer 9 can be formed at the sidewall portions with no particular modifications to the processes, and hence the insulating layer 9 for protecting the light emitting device can be easily formed.

Next, as shown in FIG. 4(c), after the refractive-index relaxation film 15 is formed on the entire surface of the substrate, the refractive-index relaxation film 15 is formed only on a portion of the upper surface of the compound semiconductor layer 6 by etching using a photoresist. The material of the refractive-index relaxation film 15 is ITO, ZrO, SiON, SiN, etc.

It is preferable that the refractive-index relaxation film 15 has a refractive index n of about $1.6<n<2.5$, a film thickness of about 50 to 200 nm, and a transmittance of about 90% or higher. The refractive-index relaxation film 15 is not electrically conductive with the n-electrode layer 7 and the p-electrode layer 8.

Next, as shown in FIG. 5(a), the n-electrode layer 7 is formed on the upper surface of the compound semiconductor layer 6 and, as shown in FIG. 5(b), the p-electrode layer 8 is formed on the support substrate 1 at the opposite side.

As shown in FIG. 1, the n-electrode layer 7 is of a laminated structure having the Ti layer 7a that is in contact with the refractive-index relaxation film 15, the Al layer 7b formed on the Ti layer 7a, and the Au layer 7c formed on the Al layer 7b. The n-electrode layer 7 is not limited to a 3-layer structure but may be a 4-layer structure of Ti/Al/Ni/Au or a 5-layer structure of Ti/Al/Ta/Pt/Au.

Thereafter, a dicing process for splitting into individual light emitting devices is performed by using a laser scribe, a laser dicer, etc.

As described above, in this embodiment, the surface of the sapphire substrate 20 is processed to have an uneven shape varying at two or more kinds of oblique angles, the compound semiconductor layer 6 is deposited on this surface, the support substrate 1 is bonded thereon by thermo compression bonding, and then the sapphire substrate 20 is peeled off by the laser lift-off method. Therefore, at the peeling-off, no excessive stress is applied to the edges of the uneven portion of the compound semiconductor layer 6, and hence the compound semiconductor layer 6 is prevented from being cracked.

Accordingly, in this embodiment, no steep angle is made for both edges of the uneven portion of the surface of the sapphire substrate 20 and of the uneven portion of the surface of the compound semiconductor layer 6 on the sapphire substrate 20. Therefore, when the sapphire substrate 20 is peeled off by the laser lift-off method, the stress applied to the edges can be reduced and hence the compound semiconductor layer 6 hardly cracks.

In the embodiment described above, an example of growing the compound semiconductor layer 6 on the sapphire substrate 20 has been mainly explained. The compound semiconductor layer 6 may, however, be grown on a SiC substrate. Also in this case, by processing the surface of the SiC substrate into an uneven shape varying at two or more kinds of oblique angles, excessive stress is not applied to the edges of the uneven shape of the compound semiconductor layer 6 when the SiC substrate is peeled off.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor light emitting device, comprising:
   a light emitting element comprising a nitride-based III-V compound semiconductor on a substrate; and first and second electrodes disposed on both sides of the light emitting element, respectively;

wherein the light emitting element comprises:

a light emitting layer;

a first conductive type semiconductor layer disposed between the light emitting layer and the first electrode; and a second conductive type semiconductor layer disposed between the light emitting layer and the second electrode, one surface of the first conductive type semiconductor layer contacting the first electrode and being a light extraction surface which comprises a rough pattern of stripe shape, the rough pattern having two or more kinds of oblique angles.

2. The device of claim 1, further comprising a refractive index relaxation film disposed on the light extraction surface of the first conductive type semiconductor layer.

3. The device of claim 1, wherein the light extraction surface has the oblique angles $\theta 1$ and $\theta 2$ with respect to a normal line direction of a substrate surface, where $20° < \theta 1 < 40°$, and $0° < \theta 2 < 20°$.

4. The device of claim 1, wherein the light emitting element is formed by laminating a plurality of layers each including $Al_xGa_{1-x-y}In_yN$, where $0 \leq x \leq 1$ and $0 \leq y \leq 1$.

5. The device of claim 1, wherein the light emitting element is a forward tapered shape configured to gradually narrow widths in order of the second conductive type semiconductor layer, the light emitting layer and the first conductive type semiconductor layer.

6. A method of fabricating a semiconductor light emitting device, comprising:

forming a rough pattern with two or more kinds of oblique angles on a surface of a peel-off target substrate by using a mask pattern of stripe shape;

forming a light emitting element comprising a nitride-based III-V compound semiconductor on a surface with the rough pattern of the peel-off target substrate;

forming a support substrate on the light emitting element;

peeling off the peel-off target substrate by laser lift off to form the light emitting element comprising a light extraction surface which comprises a rough pattern of stripe shape, the rough pattern having two or more kinds of oblique angles;

isolating the light emitting element into a plurality of light emitting devices;

forming an insulating film on at least sidewalls of the plurality of light emitting devices; and forming electrodes on upper surfaces of the plurality of light emitting devices and surfaces of the support substrate disposed at opposite side of the plurality of light emitting devices, respectively.

7. The method of claim 6, wherein the peel-off target substrate is a sapphire substrate or a SiC substrate.

8. The method of claim 6, a reflective index relaxation film is formed on the light extraction surface of each of the light emitting device.

9. The method of claim 6, wherein a mask pattern is baked, and then an edge of the mask pattern is rounded, and then the mask pattern is transferred to the peel-off target substrate to form the rough pattern.

10. The method of claim 9, wherein the mask pattern is modified into a hemisphere by a surface tension.

11. The method of claim 9, wherein the rough pattern has at least two kinds of oblique angles $\theta 1$ and $\theta 2$ with respect to a normal line direction of a substrate surface, where $20° < \theta 1 < 40°$, and $0° < \theta 2 < 20°$.

12. The method of claim 6, wherein the rough pattern is formed on the peel-off target substrate by being repeatedly transferred to the peel-off target substrate by using two kinds of mask patterns in order.

13. The method of claim 6, wherein the light emitting element is formed by laminating a plurality of layers each including $Al_xGa_{1-x-y}In_yN$, where $0 \leq x \leq 1$ and $0 \leq y \leq 1$.

14. The method of claim 6, wherein in forming the electrodes, a first electrode is formed on the light extraction surface, and a second electrode is formed on an upper surface of the support substrate; and in forming the light emitting element, a first conductive type semiconductor layer is disposed between the light emitting layer and the first electrode, and a second conductive type semiconductor layer is disposed between the light emitting layer and the second electrode.

15. The method of claim 14, wherein each of the plurality of light emitting devices is a forward tapered shape configured to gradually narrow widths in order of the second conductive type semiconductor layer, the light emitting layer and the first conductive type semiconductor layer.

16. A method of fabricating a semiconductor light emitting device, comprising:

forming a rough pattern with two or more kinds of oblique angles on a surface of a peel-off target substrate by using a mask pattern of stripe shape;

forming a light emitting element comprising a nitride-based III-V compound semiconductor on a surface with the rough pattern of the peel-off target substrate;

forming a support substrate on the light emitting element;

peeling off the peel-off target substrate by laser lift off to form the light emitting element comprising a light extraction surface roughly processed so as to have two or more kinds of oblique angles;

isolating the light emitting element into a plurality of light emitting devices;

forming an insulating film on at least sidewalls of the plurality of light emitting devices; and forming electrodes on upper surfaces of the plurality of light emitting devices and surfaces of the support substrate disposed at opposite side of the plurality of light emitting devices, respectively, wherein a mask pattern is baked, and then an edge of the mask pattern is rounded, and then the mask pattern is transferred to the peel-off target substrate to form the rough pattern.

17. The method of claim 16, wherein the peel-off target substrate is a sapphire substrate or a SiC substrate.

18. The method of claim 16, a reflective index relaxation film is formed on the light extraction surface of each of the light emitting device.

19. The method of claim 16, wherein the mask pattern is modified into a hemisphere by a surface tension.

20. The method of claim 16, wherein the rough pattern is formed on the peel-off target substrate by being repeatedly transferred to the peel-off target substrate by using two kinds of mask patterns in order.

21. The method of claim 16, wherein the rough pattern has at least two kinds of oblique angles $\theta 1$ and $\theta 2$ with respect to a normal line direction of a substrate surface, where $20° < \theta 1 < 40°$, and $0° < \theta 2 < 20°$.

22. The method of claim 16, wherein the light emitting element is formed by laminating a plurality of layers each including $Al_xGa_{1-x-y}In_yN$, where $0 \leqq x \leqq 1$ and $0 \leqq y \leqq 1$.

23. The method of claim 16, wherein in forming the electrodes, a first electrode is formed on the light extraction surface, and a second electrode is formed on an upper surface of the support substrate; and in forming the light emitting element, a first conductive type semiconductor layer is disposed between the light emitting layer and the first electrode, and a second conductive type semiconductor layer is disposed between the light emitting layer and the second electrode.

24. The method of claim 23, wherein the rough pattern has at least two kinds of oblique angles $\theta 1$ and $\theta 2$ with respect to a normal line direction of a substrate surface, where $20° < \theta 1 < 40°$, and $0° < \theta 2 < 20°$.

* * * * *